(12) United States Patent
Kim et al.

(10) Patent No.: US 7,579,249 B2
(45) Date of Patent: Aug. 25, 2009

(54) METHODS FOR FABRICATING DRAM SEMICONDUCTOR DEVICES INCLUDING SILICON EPITAXIAL AND METAL SILICIDE LAYERS

(75) Inventors: Chul-sung Kim, Kyungki-do (KR); Byeong-chan Lee, Kyungki-do (KR); Jong-ryeol Yoo, Kyungki-do (KR); Si-young Choi, Kyungki-do (KR); Deok-hyung Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 92 days.

(21) Appl. No.: 11/688,554

(22) Filed: Mar. 20, 2007

(65) Prior Publication Data

US 2007/0178642 A1   Aug. 2, 2007

Related U.S. Application Data

(62) Division of application No. 10/336,525, filed on Jan. 3, 2003, now abandoned.

(30) Foreign Application Priority Data

Aug. 2, 2002   (KR) ............................ 2002-0045893

(51) Int. Cl.
   *H01L 21/336*   (2006.01)
(52) U.S. Cl. ................ 438/300; 438/607; 257/E21.433
(58) Field of Classification Search ................ 438/222, 438/299, 300, 399, 607; 257/E21.43, E21.433, 257/E21.435

See application file for complete search history.

(56) References Cited

U.S. PATENT DOCUMENTS

| 4,791,611 A | 12/1988 | Eldin et al. |
| 4,945,070 A | 7/1990 | Hsu |
| 5,276,346 A | 1/1994 | Iwai et al. |
| 5,397,909 A | 3/1995 | Moslehi |
| 5,486,712 A | 1/1996 | Arima |
| 5,571,733 A | 11/1996 | Wu et al. |

(Continued)

FOREIGN PATENT DOCUMENTS

JP    11-330417 A    11/1999

(Continued)

OTHER PUBLICATIONS

Notice to Submit Response, with English language translation, KR Application No. 2002-0045893, May 31, 2004.

*Primary Examiner*—Minh-Loan T Tran
*Assistant Examiner*—W. Wendy Kuo
(74) *Attorney, Agent, or Firm*—Myers Bigel Sibley & Sajovec, P.A.

(57) ABSTRACT

Provided are a DRAM semiconductor device and a method for fabricating the DRAM semiconductor device. The method provides forming a silicon epitaxial layer on a source/drain region of a cell region and a peripheral circuit region using selective epitaxial growth (SEG), thereby forming a raised active region. In addition, in the DRAM semiconductor device, a metal silicide layer and a metal pad are formed on the silicon epitaxial layer in the source/drain region of the cell region. By doing this, the DRAM device is capable of forming a source/drain region as a shallow junction region, reducing the occurrence of leakage current and lowering the contact resistance with the source/drain region.

7 Claims, 8 Drawing Sheets

U.S. PATENT DOCUMENTS

| | | | |
|---|---|---|---|
| 5,571,744 A | 11/1996 | Demirlioğlu et al. | |
| 5,760,451 A | 6/1998 | Yu | |
| 5,959,324 A | 9/1999 | Kohyama | |
| 5,973,371 A | 10/1999 | Kasai | |
| 6,040,613 A | 3/2000 | McTeer et al. | |
| 6,107,154 A | 8/2000 | Lin | |
| 6,114,241 A | 9/2000 | Choi et al. | |
| 6,146,955 A | 11/2000 | Lee | |
| 6,235,575 B1 * | 5/2001 | Kasai et al. | 438/242 |
| 6,249,054 B1 | 6/2001 | Tanigawa | |
| 6,271,099 B1 | 8/2001 | Lou | |
| 6,312,994 B1 | 11/2001 | Nakamura | |
| 6,326,281 B1 | 12/2001 | Violette et al. | |
| 6,348,390 B1 | 2/2002 | Wu | |
| 6,399,450 B1 | 6/2002 | Yu | |
| 6,455,368 B2 | 9/2002 | Aoki | |
| 6,465,851 B1 | 10/2002 | Nakahata et al. | |
| 6,472,265 B1 * | 10/2002 | Hsieh | 438/241 |
| 6,548,394 B1 | 4/2003 | Peng et al. | |
| 6,559,494 B1 | 5/2003 | Taniguchi | |
| 6,576,509 B1 * | 6/2003 | Toyokawa et al. | 438/253 |
| 6,660,600 B2 | 12/2003 | Ahmad et al. | |
| 6,683,355 B2 | 1/2004 | Gonzalez et al. | |

FOREIGN PATENT DOCUMENTS

| | | |
|---|---|---|
| KR | 2000-0044936 A | 7/2000 |

* cited by examiner

METHODS FOR FABRICATING DRAM SEMICONDUCTOR DEVICES INCLUDING SILICON EPITAXIAL AND METAL SILICIDE LAYERS

CROSS-REFERENCE TO RELATED APPLICATIONS

This application is a divisional of application Ser. No. 10/336,525, entitled DRAM Semiconductor Device and Method for Fabricating the Same, filed Jan. 3, 2003 now abandoned, and claims the benefit of Korean Patent Application No. 2002-0045893, filed Aug. 2, 2002, the disclosures of both of which are hereby incorporated herein by reference in their entirety as if set forth fully herein.

BACKGROUND OF THE INVENTION

1. Field of the Invention

The present invention relates to a semiconductor device and a method for fabricating the same, and more particular to, a Dynamic RAM (DRAM) semiconductor device and a method for fabricating the same.

2. Description of the Related Art

In general, as the integration concentration of DRAM semiconductor devices increases, it is desirable to form source/drain regions as shallow junction regions so as to ensure stability of a transistor. Also, it is required to form contacts having low resistance to source/drain regions in order to achieve high-speed operation of the transistor.

First, a conventional method for fabricating a DRAM semiconductor device having source/drain regions formed as shallow junction regions and low-resistance contacts will be described.

FIGS. 1 through 3 are views for explaining a method for fabricating a DRAM semiconductor device according to the conventional art. More specifically, FIGS. 1 through 3 are views of cell regions of the DRAM semiconductor device.

Referring to FIG. 1, a gate stack pattern 18 on a semiconductor substrate 10 in which a Trench Isolation Region (TIR) and a Active Region (AR) has been determined is formed. A silicon substrate is used for the semiconductor substrate 10. The gate stack pattern 18 is formed by sequentially stacking a gate electrode constructed with a gate dielectric film (not shown), a poly-silicon film 12 and a metal suicide film 14, and a capping film 16. The gate stack pattern 18 functions as a word line.

Next, an n– source/drain region 20 is formed in the AR of the semiconductor substrate 10 to be aligned with the gate stack pattern 18. The n– source/drain region 20 is formed as a shallow junction region by ion implantation with a shallow implantation depth and a low concentration of impurities by using n-type dopants such as phosphorus (P) or arsenic (As), if the semiconductor substrate 10 is a p-type silicon substrate.

After the formation of the n– source/drain region 20, a gate spacer 22 is formed on both sidewalls of the gate stack pattern 18. Then an interlayer dielectric film 24 is formed on the semiconductor substrate 10 so as to insulate the gate stack pattern.

Referring to FIG. 2, the interlayer dielectric film 24 is patterned by photolithography. Then an interlayer dielectric film pattern 24a having a contact hole 26 exposing the n– source/drain region 20 is formed.

Referring to FIG. 3, a barrier film 28 formed of Ti/TiN is formed on the wall of the contact hole 26. Then, pads 30a and 30b of a tungsten film are formed on the barrier film 28. The pad 30a is connected to a storage electrode during a subsequent process and the pad 30b is connected to a bit line during the subsequent process. After that, a DRAM semiconductor device is completed through a general processes such as a bit line forming process and a capacitor forming process or the like.

As described above, in a conventional method for fabricating a DRAM semiconductor device, a titanium silicide film is formed by a reaction of the n– source/drain region with the Ti film constituting the barrier film during a thermal process after the barrier film forming process. The Ti silicide film penetrates into the n– source/drain region so that the n– source/drain region is not able to become a shallow junction region and leakage current is increased during operation of the DRAM semiconductor device.

SUMMARY OF THE INVENTION

It is an object of the present invention to provide a DRAM semiconductor device having a source/drain region as a shallow junction region and a contact having a low resistance.

It is another object of the present invention to provide a method for fabricating the DRAM semiconductor device.

In one aspect, the present invention provides a DRAM semiconductor device comprising a gate stack pattern formed on a semiconductor substrate, a source/drain region which is aligned with both sidewalls of the gate stack pattern and formed on the semiconductor substrate, a gate spacer formed on both sidewalls of the gate stack pattern, a silicon epitaxial layer formed on the source/drain region on both sides of the gate spacer, a metal silicide layer formed on the silicon epitaxial layer and a metal pad formed on the metal silicide layer.

Preferably, the source/drain region is an n– source/drain region.

In another aspect, the present invention provides a DRAM semiconductor device comprising a gate stack pattern formed on a cell region and a peripheral circuit region of a semiconductor substrate, a n– source/drain region which is aligned with both sidewalls of the gate stack pattern of the cell region and formed on the semiconductor substrate, a n+ source/drain region and a p+ source/drain region which is aligned with both sidewalls of the gate stack pattern of the peripheral circuit region and formed on the semiconductor substrate, a gate spacer formed on both sidewalls of the gate stack pattern of the cell region and the peripheral circuit region, a silicon epitaxial layer formed on the n– source/drain region, the n+ source/drain region and the p+ source/drain region of a lower portion of both sides of the gate spacer, a metal silicide layer formed on the silicon epitaxial layer of the cell region and the peripheral circuit region, a metal pad formed on the metal silicide layer of the cell region and a metal plug formed on the metal silicide layer of the peripheral circuit region.

Preferably, the metal pad is level with equivalent to or higher than the gate stack pattern. The metal silicide layer is one of a cobalt silicide layer, a titanium silicide layer and a nickel silicide layer. The metal pad and the metal plug are constructed with a tungsten film.

In another aspect, the present invention provides a method for fabricating a DRAM semiconductor device comprising forming a gate stack pattern on a semiconductor substrate, forming a source/drain region on the semiconductor substrate, which is aligned with both sidewalls of the gate stack pattern, forming a silicon epitaxial layer on the source/drain region of both sidewalls of the gate spacer, forming a metal silicide layer on the silicon epitaxial layer and forming a metal pad on the metal silicide layer.

In another aspect, the present invention provides a method for fabricating a DRAM semiconductor device comprising forming a gate stack pattern on a cell region and a peripheral circuit region of a semiconductor substrate, forming a n− source/drain region on the semiconductor substrate of the cell region, to be aligned with both sidewalls of the gate stack pattern of the cell region, and forming a n+ source/drain region and a p+ source/drain region on the semiconductor substrate of the peripheral circuit region, forming a gate spacer on both sidewalls of the gate stack pattern of the cell region and the peripheral circuit region, forming a silicon epitaxial layer on the n− source/drain region, the n+ source/drain region and the p+ source/drain region of a lower portion of both sides of the gate spacer, forming a metal silicide layer on the silicon epitaxial layer of the cell region and the peripheral circuit region, forming a metal pad on the metal silicide layer of the cell region and forming a metal plug on the metal silicide layer of the peripheral circuit region.

Preferably, the metal pad is level with or higher than the gate stack pattern. The metal silicide layer is one of a cobalt silicide layer, a titanium silicide layer and a nickel silicide layer. Preferably, the metal pad and the metal plug are a tungsten film. The source/drain regions are the n− source/drain regions. The silicon epitaxial layer is formed by using selective epitaxial growth.

The DRAM semiconductor device according to the present invention has a raised active region formed on the source/drain region of a cell region and a peripheral circuit region so that the source/drain region can be formed as a shallow junction region and the occurrence of leakage current can be reduced.

In addition to the foregoing, in the DRAM semiconductor device of the present invention, a metal silicide layer and a metal pad are formed on a silicon epitaxial layer in the source/drain region of the cell region and the peripheral circuit region, thereby reducing a contact resistance.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
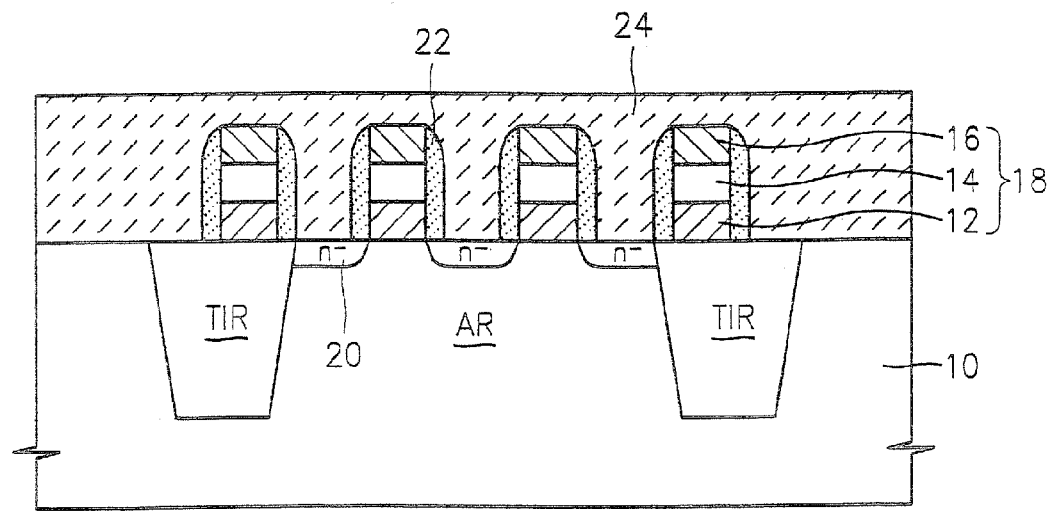
FIGS. 1 through 3 are views for explaining a conventional method for fabricating a DRAM semiconductor device.
Figure 2:
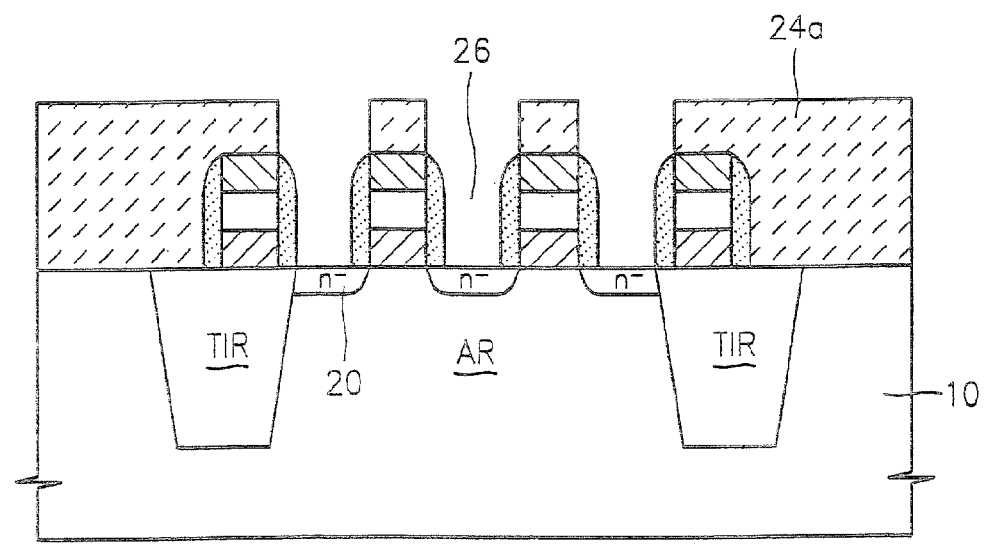
Figure 3:
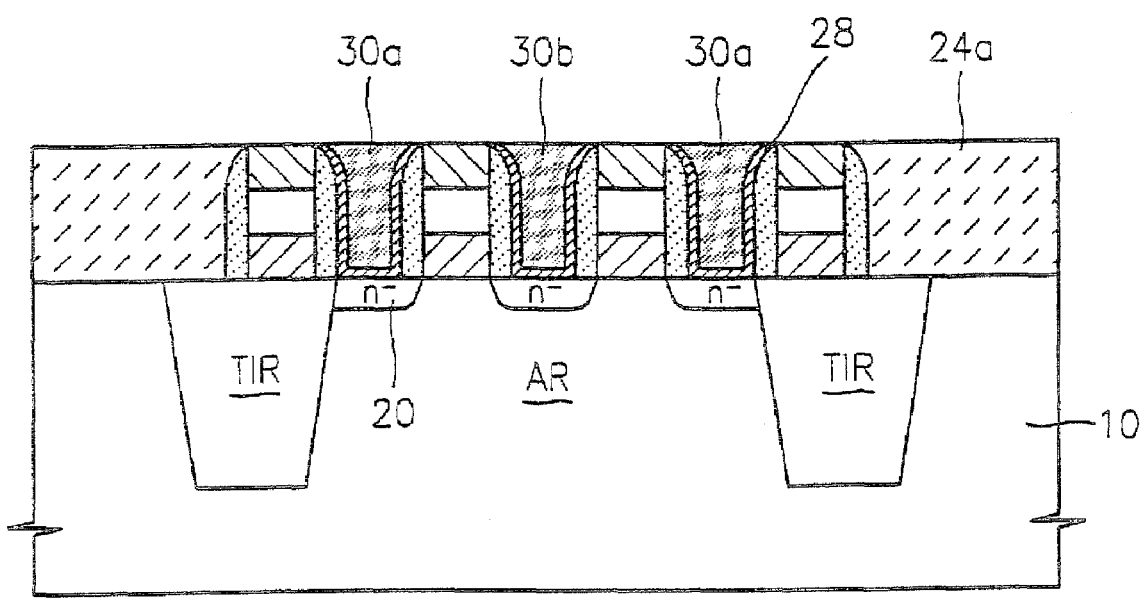

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present.

Figure 4A:
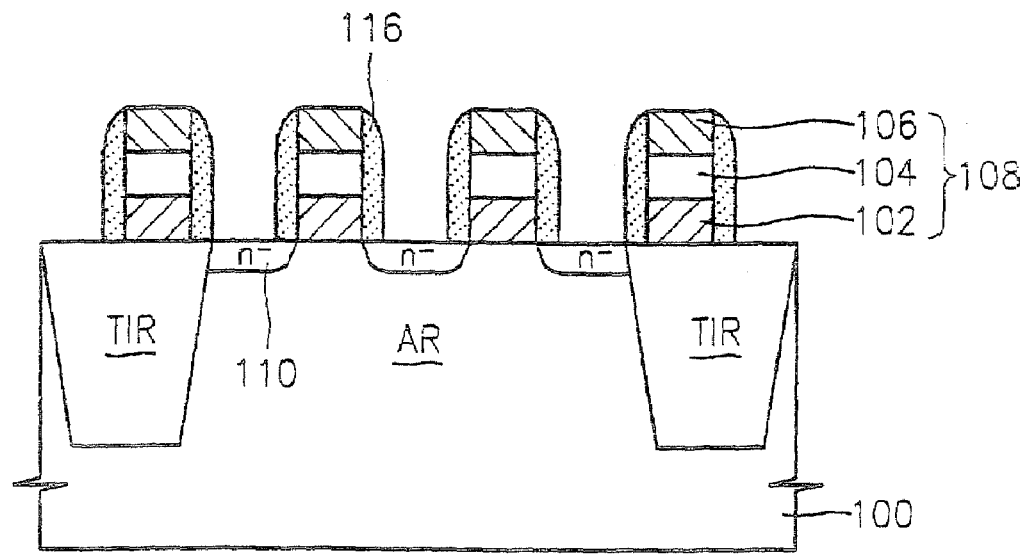
FIGS. 4A through 4F and 5A through 5F are views for explaining a DRAM semiconductor device and a method of fabricating the DRAM semiconductor device according to the present invention.
Figure 5A:
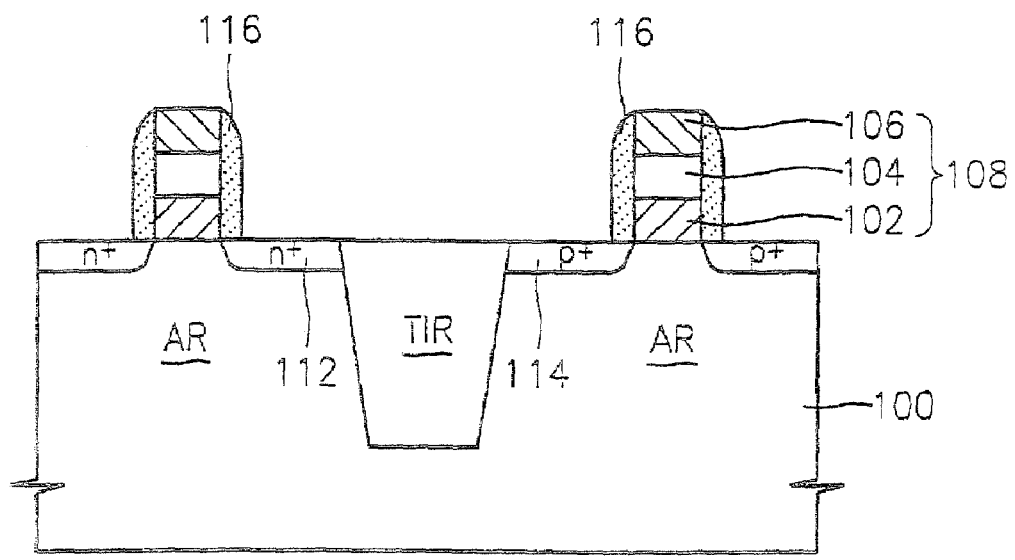
Figure 4B:
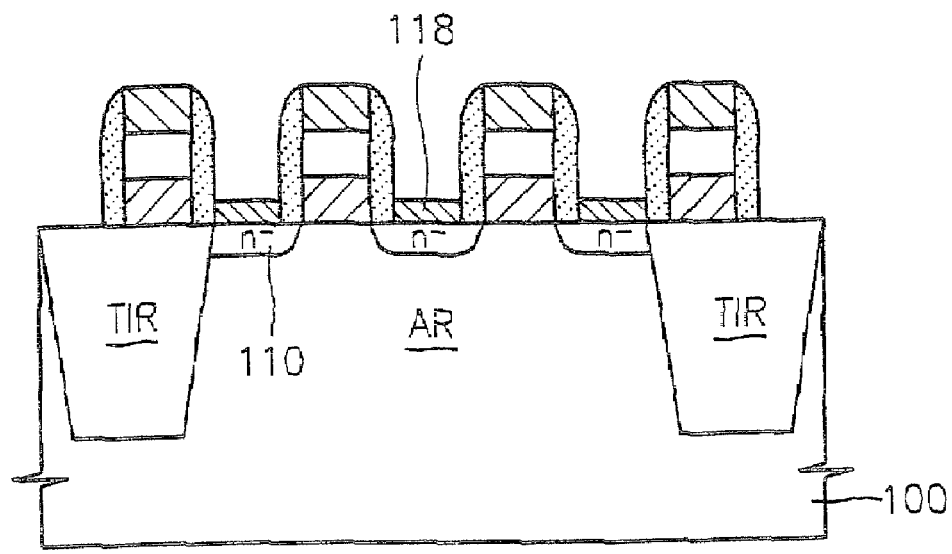
Figure 5B:
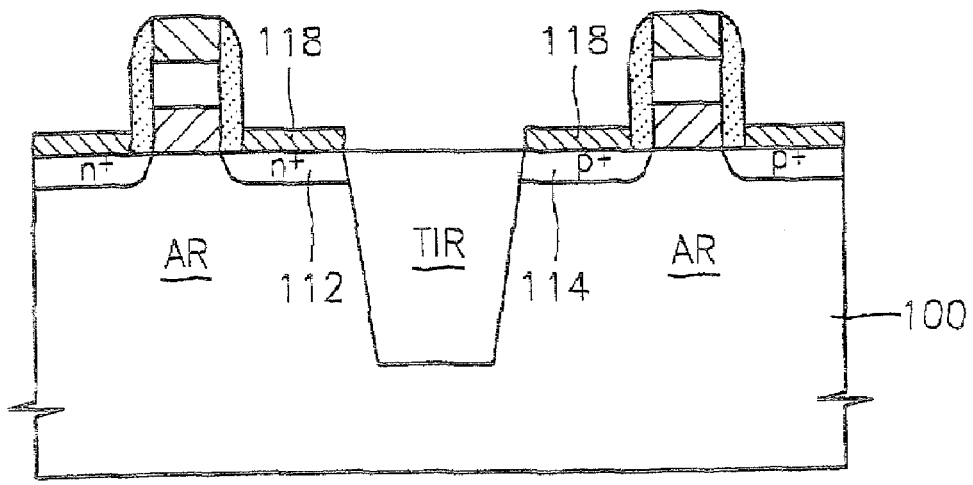
Figure 4C:
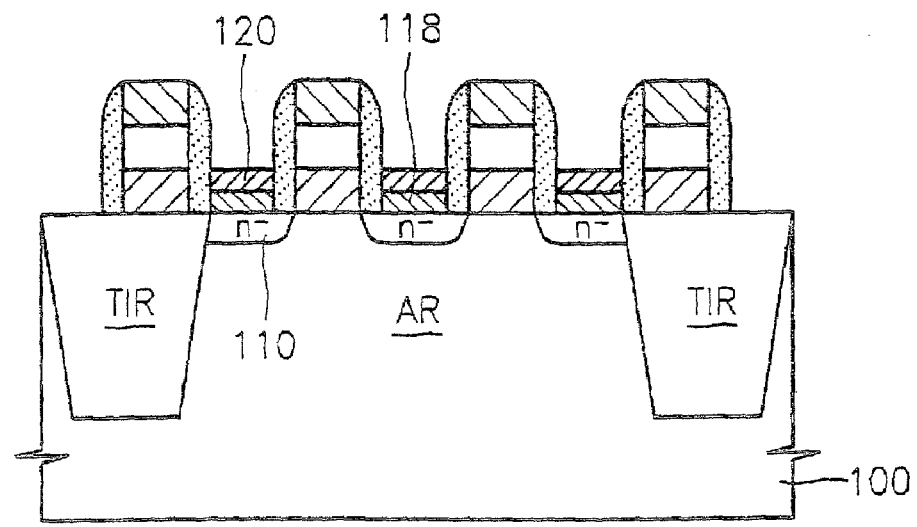
Figure 5C:
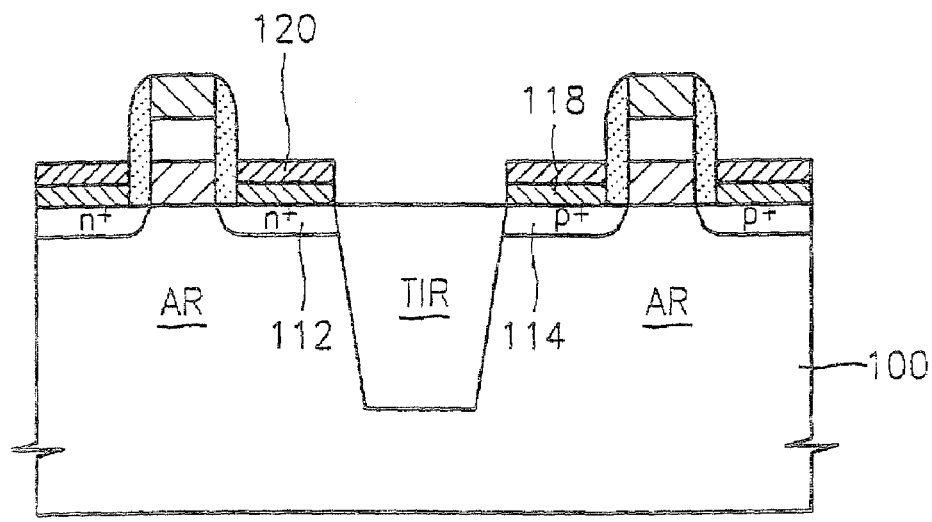
Figure 4D:
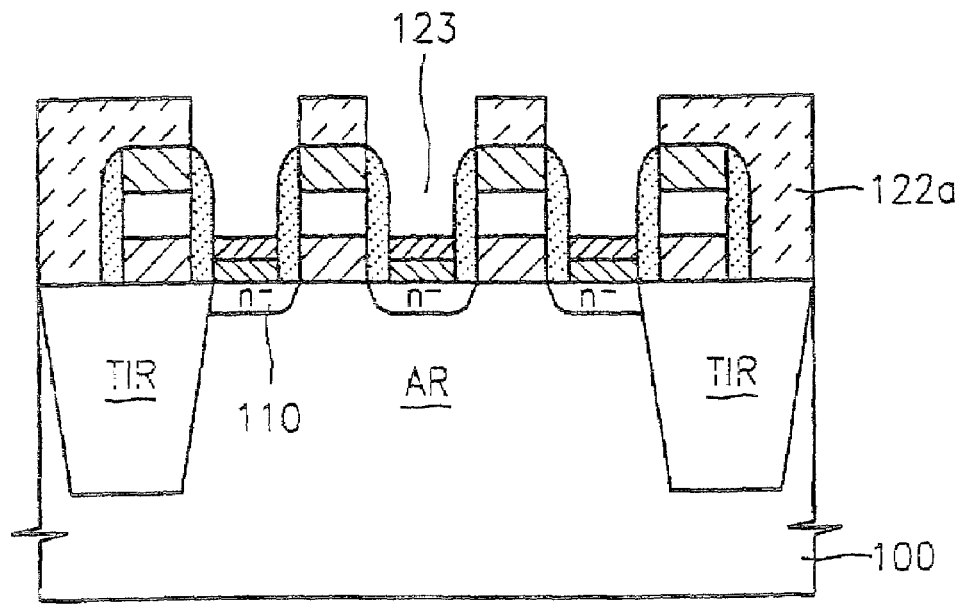
Figure 5D:
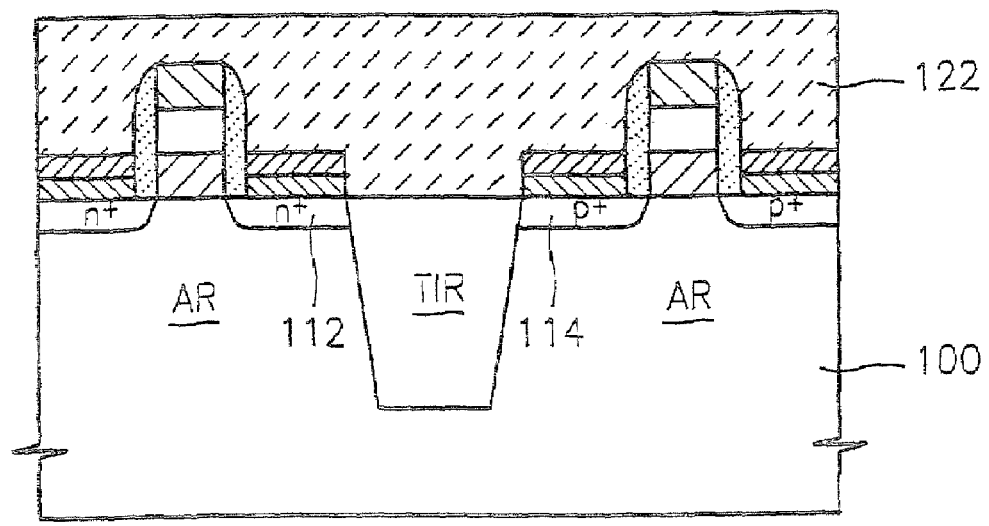
Figure 4E:
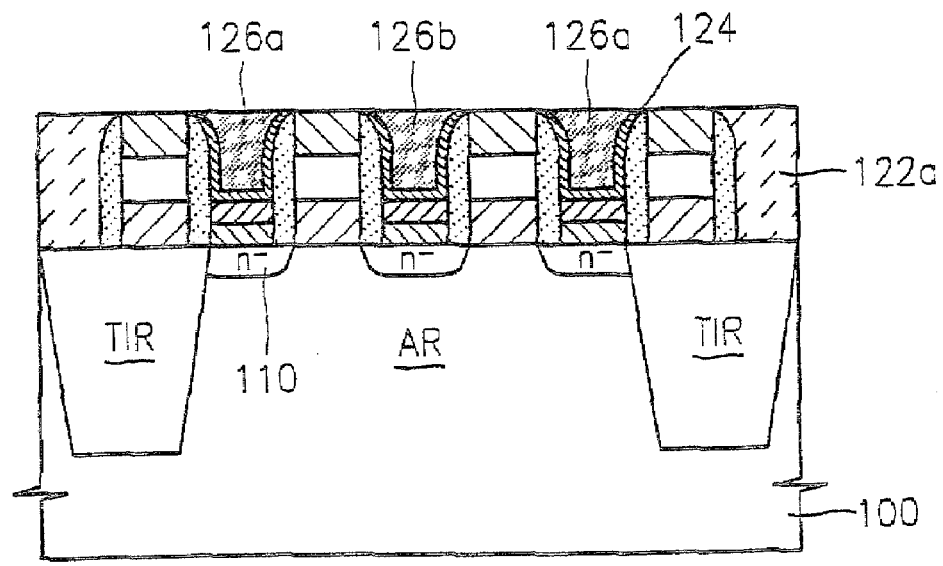
Figure 5E:
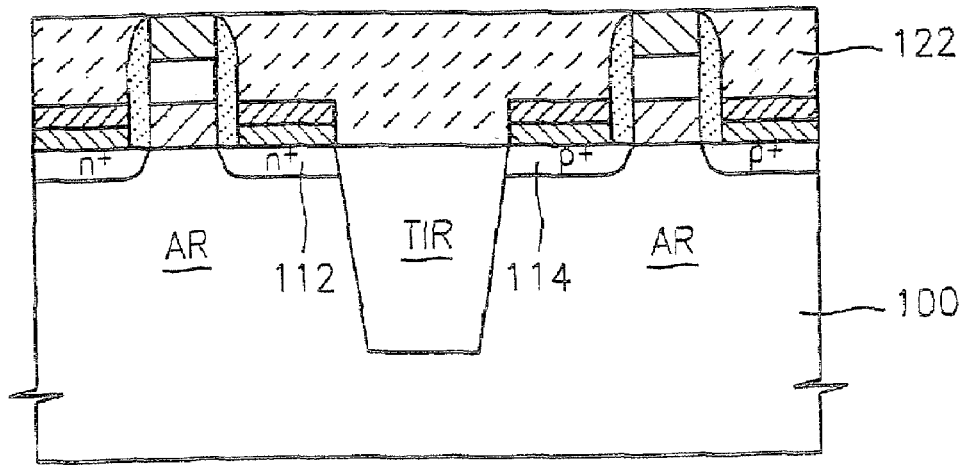
Figure 4F:
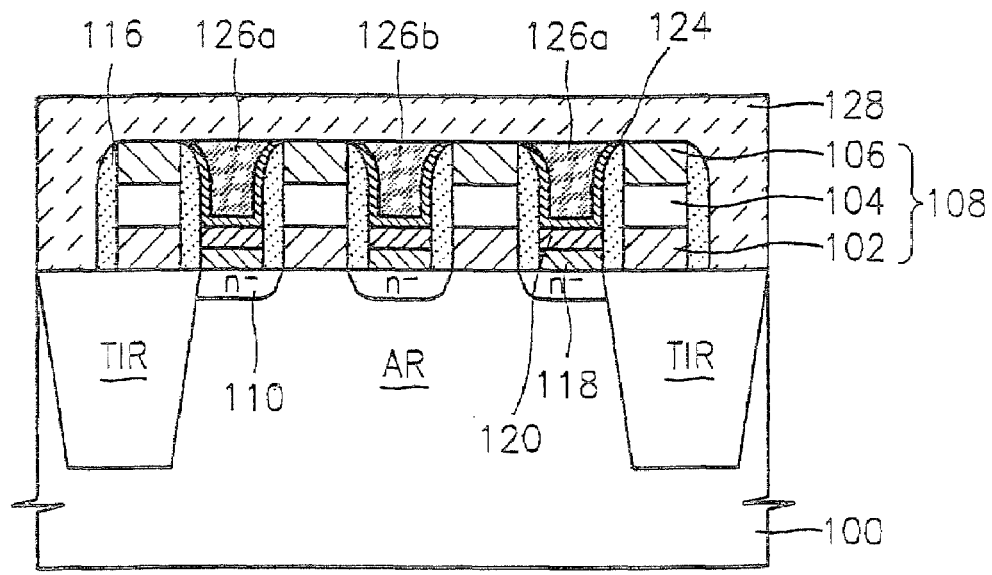
Figure 5F:
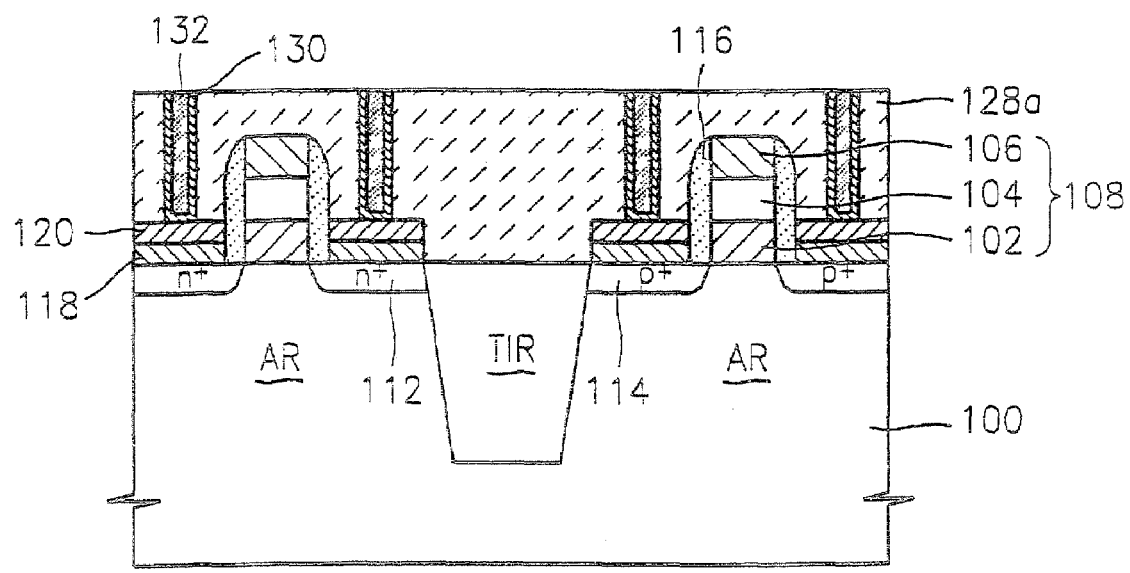

FIGS. 4F and 5F are sectional views of a cell region and a peripheral circuit region of the DRAM semiconductor device according to the present invention.

Specifically, an n-MOS (Metal Oxide Semiconductor) transistor is formed in the cell region of the DRAM semiconductor device as shown in FIG. 4F. As shown in FIG. 5F, in the other regions excluding the cell region, i.e., the peripheral circuit region of the DRAM semiconductor device. An n-MOS transistor and p-MOS transistor are formed. However, either n-MOS transistors or p-MOS transistors may be formed in the peripheral circuit region of the DRAM semiconductor device, if necessary.

More specifically, the DRAM semiconductor device according to the present invention includes a semiconductor substrate 100 having an Active Region (AR) and a Trench Isolation Region (TIR). The semiconductor substrate 100 is a p-type silicon substrate. The TIR is constructed of a trench by etching the semiconductor substrate 100 and a buried oxide film.

A gate stack pattern 108 is formed on the semiconductor substrate 100 having the AR and the TIR. The gate stack pattern 108 is constructed with a gate dielectric film (not shown), gate electrodes 102 and 104 and a capping film 106. The gate dielectric film is constructed with an oxide film. The gate electrodes 102 and 104 are constructed with a polysilicon film 102 and a tungsten silicide film 104. The capping film 106 is a nitride film.

As shown in FIG. 4F, on the AR of the cell region of the semiconductor substrate 100 of the cell region, an n− source/drain region 110 aligned with the gate stack pattern 108 is formed. The n− source/drain region 110 of the cell region is constructed as a shallow junction region. As shown in FIG. 5F, n+ source/drain region 112 and p+ source/drain region 114 aligned with the gate stack pattern 108 on the active region (AR) of the semiconductor substrate 100 of the peripheral circuit region are formed.

A gate spacer 116 is formed on both sidewalls of the gate stack pattern 108 of the cell region and the peripheral circuit region. The gate spacer 116 is constructed with the nitride film. A silicon epitaxial layer 118 is selectively formed on the n− source/drain region 110, the n+ source/drain region 112 and the p+ source/drain region 114 at both sides of the gate spacer 116 of the cell region and the peripheral circuit region, so as to construct a raised active region.

The silicon epitaxial layer 118 makes it possible to form a shallow junction and reduces the occurrence of leakage current by preventing damage to the n− source/drain region 110 in a subsequent thermal process. The silicon epitaxial layer 118 of the cell region and the peripheral circuit region prevents the metal silicide layer from penetrating into the n− source/drain region 110, the n+ source/drain region 112 and the p+ source/drain region 114 in a subsequent thermal process, thereby reducing the occurrence of leakage current.

A metal silicide layer 120 is formed on the silicon epitaxial layer 118 of the cell region and the peripheral circuit region. The metal silicide layer 120 may be a cobalt silicide layer, a titanium silicide layer or a nickel silicide layer. The metal silicide layer 120 lowers a contact resistance when a bit line, a storage electrode of a capacitor and a wiring layer are connected to the n− source/drain region, the n+ source/drain region and the p+ source/drain region, respectively, during a subsequent process.

Barrier films 124 and 130 formed of a Ti/TiN film are formed on the metal silicide layer 120 of the cell region and the peripheral circuit region, respectively. The metal pads 126a and 126b are formed on the barrier film 124 of the cell region. A metal plug 132 is formed on the barrier film 130 of the peripheral circuit region. The metal pad 126a is connected to the storage electrode of the capacitor. The metal pad 126b is connected to the bit line. The metal pads 126a and 126b and the metal plug 132 are level with or higher than the gate stack pattern 108. The metal pads 126a and 126b and the metal plug 132 are constructed with the tungsten film. The metal pads 126a and 126b and the metal plug 132 lower a contact resistance when a bit line, a storage electrode of a capacitor and a wiring layer are connected to the n− source/drain region, the n+ source/drain region and the p+ source/drain region, respectively, during a subsequent process. The reference numerals 128 and 128a of FIGS. 4F and 5F denote an interlayer dielectric film.

Hereinafter, a method for fabricating a DRAM semiconductor device according to the present invention will be described.

FIGS. 4A through 4F and 5A through 5F are sectional views for explaining a method of fabricating a DRAM semiconductor device according to the present invention. FIGS. 4A through 4F are views of a method for fabricating a cell region of a DRAM semiconductor device according to the present invention. FIGS. 5A through 5F are views of a method for manufacturing of a peripheral circuit region of a DRAM semiconductor device according to the present invention.

Referring to FIGS. 4A and 5A, the gate stack pattern 108 is formed on the semiconductor substrate 100 having the AR and the TIR. The silicon substrate is used as the semiconductor substrate 100. The gate stack pattern 108 is constructed with the gate dielectric film (not shown), the gate electrodes 102 and 104 and the capping film 106. The gate dielectric film is an oxide film. The gate electrodes 102 and 104 are formed of a poly-silicon film and a tungsten silicide film. The capping film 106 is an nitride film.

Next, the n− source/drain region 110 aligned with the gate stack pattern 108 is formed on the AR of the cell region of the semiconductor substrate 100 of the cell region as shown in FIG. 4A. The n− source/drain region 110 is formed as a shallow junction region by an ion implantation with a shallow implantation depth and a low concentration of impurities by using n-type dopants such as phosphorus (P) or arsenic (As), if the semiconductor substrate 100 is a p-type silicon substrate. A concentration of the dopants in the n− source/drain region 110 is adjusted to $1E18/cm^3$–$1E20/cm^3$.

After that, the n+ source/drain region 112 and the p+ source/drain region 114 aligned with the gate stack pattern 108 are formed on the active region (AR) of the semiconductor substrate 100 of the peripheral circuit region as shown in FIG. 5A. The n+ source/drain region 112 is formed with n-type dopants such as phosphorus (P) or arsenic (As) if the semiconductor substrate 10 is a p-type silicon substrate. A concentration of the dopants in the n− source/drain region 110 is adjusted to $1E20/cm^3$–$1E22/cm^3$. The p+ source/drain region 114 is formed by the p-type dopants such as boron if the semiconductor substrate 10 is a p-type silicon substrate. A concentration of the dopants in the p+ source/drain region 114 is adjusted to $1E20/cm^3$–$1E22/cm^3$.

Then, a gate spacer 116 is formed on both sidewalls of the gate stack pattern 108 of the cell region and the peripheral circuit region. The gate spacer 116 is formed by forming a nitride film on the whole surface of the semiconductor substrate 100 in which the gate stack pattern 108 is formed, and anisotropically etching the nitride film 100.

Referring FIGS. 4B and 5B, the silicon epitaxial layer 118 is selectively formed on the n− source/drain region 110 of the cell region, the n+ source/drain region 112 and the p+ source/drain region 114 of the peripheral circuit region by Selective Epitaxial Growth (SEG), so as to construct a raised active region. The silicon epitaxial layer 118 of the cell region makes it possible to form a shallow junction and reduce the occurrence of leakage current by preventing damage to the n− source/drain region 110 in a subsequent thermal process. The silicon epitaxial layer 118 of the cell region and the peripheral circuit region prevents the metal silicide layer from penetrating into the n− source/drain region 110, the n+ source/drain region 112 and the p+ source/drain region 114 in the subsequent thermal process, thereby reducing the occurrence of leakage current.

Referring FIGS. 4C and 5C, the metal silicide layer 120 is formed on the silicon epitaxial layer 118 of the cell region and the peripheral circuit region. The metal silicide layer 120 may be a cobalt silicide layer, a titanium silicide layer or a nickel silicide layer. The metal silicide layer 120 lowers a contact resistance when the bit line and the storage electrode of the capacitor are connected to the n− source/drain region 110, the n+ source/drain region 112 and the p+ source/drain region 114 in a subsequent process.

The metal silicide layer 120 is formed by a self-aligned silicide process. In other words, the metal silicide layer 120 is constructed by forming a metal layer on the whole surface of the semiconductor substrate 100 in which the cell region and the peripheral circuit region are formed, applying a thermal process and then a silicidation process. In the silicidation process, the silicon epitaxial layer 118 functions as a protection layer to prevent damage to the n− source/drain region 110, the n+ source/drain region 112 and the p+ source/drain region 114.

Referring to FIGS. 4D and 5D, a first interlayer dielectric film 122 is formed on the whole surface of the cell region and the peripheral circuit region of the semiconductor substrate in which the gate stack pattern 108 and the metal silicide layer 120 are respectively formed. Then, as illustrated in FIG. 4D, the interlayer dielectric film 122 of the cell region is patterned by photolithography to form the interlayer dielectric film 122a, which has a contact hole 123 exposing the metal silicide layer 120 of the cell region.

Referring to FIGS. 4E and 5E, a barrier film 124 formed of Ti/TiN is formed on the whole surface of the cell region and the peripheral circuit region of the semiconductor substrate 100. Then, a metal layer, e.g., a tungsten film, is formed on the whole surface of the cell region of the semiconductor substrate 100 to fill the contact hole 123 and the peripheral circuit region, and metal pads 126a and 126b are formed by planarizing the semiconductor substrate 100. A chemical mechanical polishing method or an etch back method is used for the planarization. When performing the planarization, a surface of an upper portion of the gate stack pattern 108 can be used for an etching stop point. The metal pads 126a and 126b are level with or higher than the gate stack pattern 108.

The metal pads 126a and 126b lower the contact resistance when the n− source/drain region 110 is connected to the bit line or the storage electrode. The metal pad 126a is connected to the storage electrode in a subsequent process. The metal pad 126b is connected to the bit line in the subsequent process.

Referring to FIGS. 4F and 5F, a second interlayer dielectric film 128 is formed on the whole surface of the semiconductor substrate 100 of the cell region and the peripheral circuit region. Then, the second interlayer dielectric film 128 is patterned to form a second interlayer dielectric film pattern 128a to expose the metal silicide layer 120 of the peripheral circuit region. After that, a barrier layer 130, e.g., Ti/TiN film, a metal layer, e.g., a tungsten film, are formed on the whole surface of the semiconductor substrate 100 and the metal layer is planarized to from a metal plug 132. When performing the planarization, a surface of an upper portion of the gate stack pattern 108 can be used for an etching rest point. The metal plug 132 is level with the gate stack pattern 108. The metal plug 132 lowers the contact resistance when the n+ source/drain region 112 and the p+ source/drain region 114 are connected to a wiring layer in a subsequent process. After that, the second interlayer dielectric film 128 of the cell region is patterned and, eventually, a DRAM semiconductor device is completed through general processes such as a bit line forming process and a capacitor forming process or the like, in which the metal pads 126a and 126b are connected to a bit line or a storage electrode of a capacitor.

As can be seen from the above, the silicon epitaxial layer is formed on a cell region and a source/drain region of a peripheral circuit region using SEG, so as to construct a raised active region. By doing this, it is possible to form a source/drain region as a shallow junction region in a cell region and to reduce the occurrence of leakage current by preventing a metal silicide layer from penetrating into the source/drain region in the cell region and the peripheral circuit region in a subsequent process.

In the DRAM semiconductor device according to the present invention, a metal silicide layer and a metal pad are formed on a silicon epitaxial layer on the source/drain region of the cell region, and therefore, it is possible to lower a contact resistance between the source/drain region and the bit line or the storage electrode.

In addition to the foregoing, in the DRAM semiconductor device of the present invention, a metal silicide layer and a metal plug are formed on a silicon epitaxial layer in the source/drain region of the cell region and the peripheral circuit region thereby reducing the contact resistance between the source/drain region and a wiring layer.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for fabricating a DRAM semiconductor device comprising:

forming a gate stack pattern on a cell region and a peripheral circuit region of a semiconductor substrate;

forming a pair of n− source/drain regions in the cell region of the semiconductor substrate, a respective one of which extends to a respective opposing sidewall of the gate stack pattern of the cell region;

forming a pair of n+ source/drain regions and a pair of p+ source/drain regions in the peripheral circuit region of the semiconductor substrate, a respective source/drain region of which extends to a respective sidewall of a respective gate stack in the gate stack pattern of the peripheral circuit region in the semiconductor substrate;

forming a gate spacer on both opposing sidewalls of the gate stack pattern of the cell region and the peripheral circuit region after forming the pair of n+ source/drain regions and the pair of p+ source/drain regions in the peripheral circuit region in the semiconductor substrate;

forming a silicon epitaxial layer on the n− source/drain regions, the n+ source/drain regions and the p+ source/drain regions on a lower portion of both sides of the gate spacer;

forming a metal silicide layer on the silicon epitaxial layer of the cell region and on the silicon epitaxial layer of the peripheral circuit region;

forming a metal pad on the metal silicide layer of the cell region; and forming a metal plug on the metal silicide layer of the peripheral circuit region.

2. The method of claim 1, wherein the metal pad is level with or higher than the gate stack pattern.

3. The method of claim 1, wherein the metal silicide layer is at least one of a cobalt silicide layer, a titanium silicide layer and a nickel silicide layer.

4. The method of claim 1, wherein the metal pad and the metal plug comprise a tungsten film.

5. The method of claim 1, the silicon epitaxial layer is formed by using selective epitaxial growth.

6. The method of claim 1, wherein the gate stack pattern comprises a gate dielectric film, a gate electrode on the gate dielectric film and a capping film on the gate electrode.

7. The method of claim 1 further comprising forming a barrier layer on the metal silicide layer of the cell region and the peripheral circuit region, wherein forming a metal pad comprises forming a metal pad on the barrier layer of the cell region and wherein forming a metal plug comprises forming a metal plug on the barrier layer of the peripheral circuit region.

* * * * *